United States Patent
Pu et al.

(10) Patent No.: US 7,102,239 B2
(45) Date of Patent: Sep. 5, 2006

(54) CHIP CARRIER FOR SEMICONDUCTOR CHIP

(75) Inventors: Han-Ping Pu, Taichung Hsien (TW); Chang-Fu Lin, Taichung Hsien (TW); Chien-Ping Huang, Taichung Hsien (TW)

(73) Assignee: Siliconware Precision Industries Co., Ltd., (TW)

( * ) Notice: Subject to any disclaimer, the term of this patent is extended or adjusted under 35 U.S.C. 154(b) by 216 days.

(21) Appl. No.: 10/909,029

(22) Filed: Jul. 30, 2004

(65) Prior Publication Data

US 2005/0040524 A1    Feb. 24, 2005

(30) Foreign Application Priority Data

Aug. 18, 2003  (TW) .............................. 92122583 A

(51) Int. Cl.
*H01L 23/48* (2006.01)
(52) U.S. Cl. ..................... 257/778; 257/678; 257/734
(58) Field of Classification Search ................ 257/778, 257/678, 734
See application file for complete search history.

(56) References Cited

U.S. PATENT DOCUMENTS

| | | | | |
|---|---|---|---|---|
| 5,710,063 | A * | 1/1998 | Forehand et al. | 438/106 |
| 6,750,084 | B1 * | 6/2004 | Delheimer | 438/117 |
| 6,774,497 | B1 * | 8/2004 | Qi et al. | 257/783 |
| 6,787,918 | B1 * | 9/2004 | Tsai et al. | 257/778 |

* cited by examiner

*Primary Examiner*—Long Pham
(74) *Attorney, Agent, or Firm*—Peter F. Corless; Steven M. Jensen; Edwards Angell Palmer & Dodge LLP

(57) ABSTRACT

A chip carrier for a semiconductor chip is provided. A plurality of solder pads for bump soldering are formed on a chip mounting surface of the chip carrier, to allow a flip chip to be mounted and electrically connected to the chip carrier. A solder mask layer is formed on the chip carrier, wherein a plurality of openings are provided in the solder mask layer to expose the solder pads, and an outwardly opening extended portion is formed respectively from the openings corresponding to the solder pads having a relatively narrower pitch therebetween, so as to prevent formation of voids during an underfill process for filing a gap between the flip chip and the chip carrier.

8 Claims, 5 Drawing Sheets

CHIP CARRIER FOR SEMICONDUCTOR CHIP

FIELD OF THE INVENTION

The present invention relates to chip carriers for semiconductor chips, and more particularly, to a chip carrier for accommodating a semiconductor chip, with solder pads being arranged in differently sized pitches on the chip carrier.

BACKGROUND OF THE INVENTION

The current trend for developing electronic products is heading towards fabricating a device with a minimized and compact size, improved functions, and increased input/output connections. Typically, a conventional semiconductor package is fabricated by packaging a single integrated circuit (IC) or semiconductor chip with a lead frame or substrate via processes such as die attach, wire bonding, molding, and trim and form processes, making the size of the fabricated package be several times of that of the semiconductor chip. A later developed flip-chip technology involves forming gold (Au), tin/lead (Sn/Pb) or other metal bumps on the semiconductor chip, allowing the metal bumps to be soldered to solder pads on a flip-chip substrate. The current flip-chip technology has been improved in a manner that a package can be made having a size almost the same as that of the chip, and such package is customarily referred to as Chip Scale Package (CSP). The flip-chip technology provides significant benefits, such as high density, low induction, easy control over high frequency noise, minimized package size, and so on, thus fulfilling the packaging requirements for the above-mentioned highly efficient and portable products in the future.

Although the flip-chip semiconductor package has the above benefits, it is still necessary to further improve the current packaging technology in terms of downsizing the device in response to the semiconductor fabrication process developed towards a finer pitch arrangement. Referring to FIG. 1a showing a conventional flip-chip semiconductor chip carrier 1, a plurality of solder pads 11 are formed on predetermined positions of a substrate 10, for allowing a plurality of metal bumps on a semiconductor chip (not shown) to be soldered to the solder pads 11 on the substrate 10. A typical pitch between the adjacent solder pads is limited to the size of about 200 to 250 μm according to the current substrate manufacturing capacity. However, for a flip-chip package having a chip formed with solder pads at its peripheral positions, the pitch between metal bumps on the chip is always sized smaller than 150 μm. Therefore, in such flip-chip package, as shown in FIG. 1b disclosed in U.S. Pat. No. 6,404,064, solder pads 11' on a substrate 10' are formed by grooves 13 in a solder mask layer 12 on the substrate 10' so as to achieve a pitch sized smaller than 150 μm between the adjacent solder pads 11'.

Although the above-mentioned technique can solve the problem of reducing the pitch between the adjacent solder pads, other serious problems are incurred as a result of variously sized pitches between the solder pads. Referring to FIG. 1c, there are at least formed a pitch A and a pitch B between the adjacent solder pads 11", wherein the pitch A is sized smaller than the pitch B. As shown in FIG. 1d, once a semiconductor chip 17 is mounted on the substrate 10' in a flip-chip manner and a reflow process is performed for soldering the metal bumps on the chip 17 to the solder pads 11' on the substrate 10', then an underfill process is carried out to fill a gap between the chip 17 and the substrate 10' with an underfill resin 14. Since the underfill resin 14 flows faster through the relatively wider pitch B than the relatively narrower pitch A, voids 15 would be formed by air trapped in the relatively narrower pitch A as shown in FIG. 1e. Subsequently, as shown in FIG. 1f, an undesirable bridging effect between the metal bumps may be caused by the voids 15 between the adjacent metal bumps 16 during subsequent reflow and surface-mount technology (SMT) processes, thereby reducing the package yield.

Therefore, the problem to be solved here is to provide a chip carrier with bumps pads being arranged in differently sized pitches so as to prevent formation of voids due to differently sized pitches between the solder pads during an underfill process.

SUMMARY OF THE INVENTION

A primary objective of the present invention is to provide a chip carrier for a semiconductor chip, with a plurality of solder mask openings having different sizes being formed on the chip carrier to correspond to differently sized pitches between solder pads, so as to reduce formation of voids during an underfill process.

Another objective of the present invention is to provide a chip carrier for a semiconductor chip, with a plurality of solder mask openings having different sizes being formed on the chip carrier to correspond to differently sized pitches between solder pads, so as to prevent an bridging effect between bumps caused by voids formed in the pitches and assure the quality of products.

In accordance with the above and other objectives, the present invention proposes a chip carrier for a semiconductor chip. The chip carrier comprises: a chip carrier body; a solder mask layer formed on the chip carrier body and having a plurality of openings; and a plurality of solder pads exposed in the openings, with at least two differently sized pitches being provided between the adjacent solder pads. The openings corresponding to the solder pads having the relatively smaller pitch are further formed with opening extended portions respectively that extend outwardly with respect to the chip carrier.

Compared to the prior art, the chip carrier in the present invention is formed with solder mask openings having different sizes to correspond to differently sized pitches between the adjacent solder pads on the chip carrier, so as to prevent formation of voids during an underfill process.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1A:
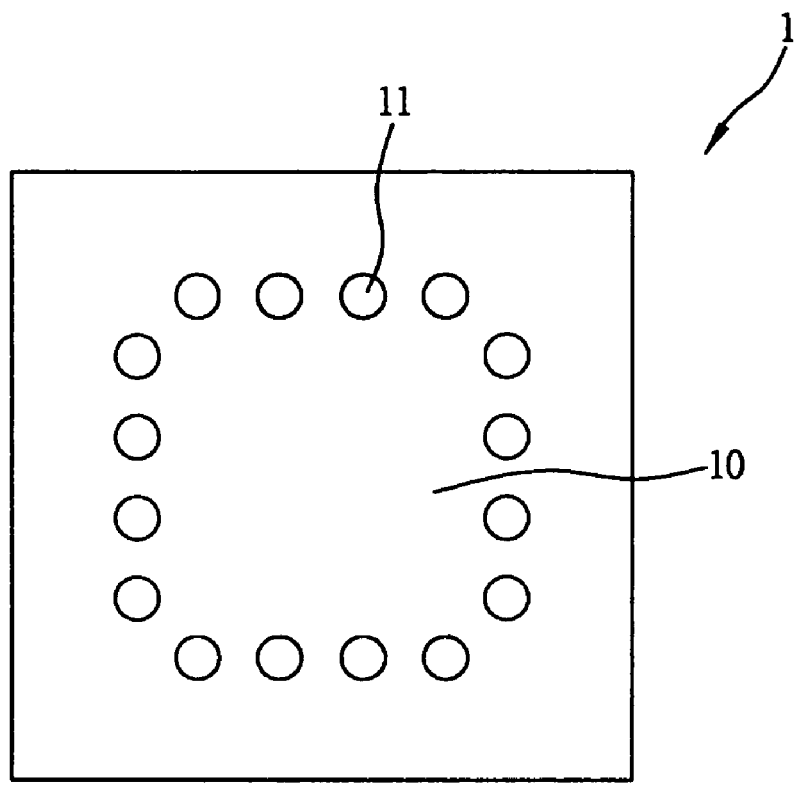
FIGS. 1a to 1c (PRIOR ART) are schematic diagrams respectively showing a partial top view of a conventional semiconductor package.
Figure 1B:
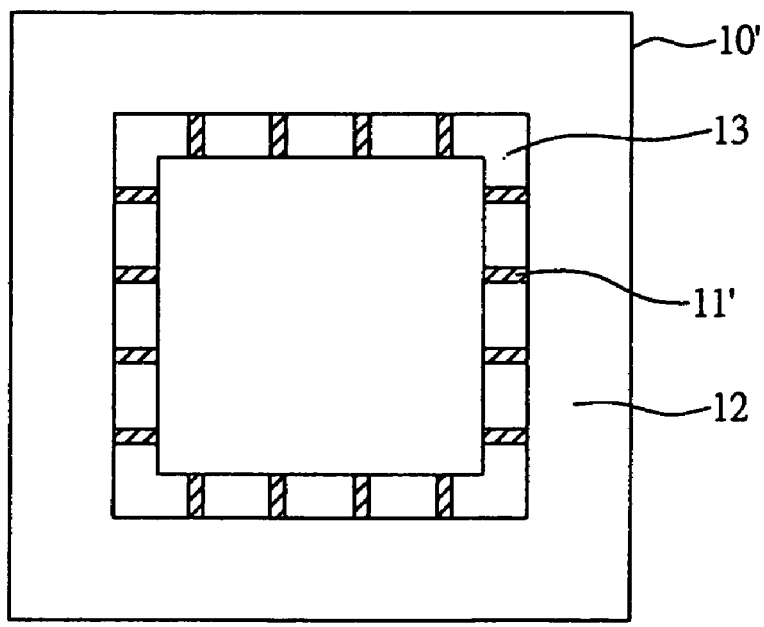
Figure 1C:
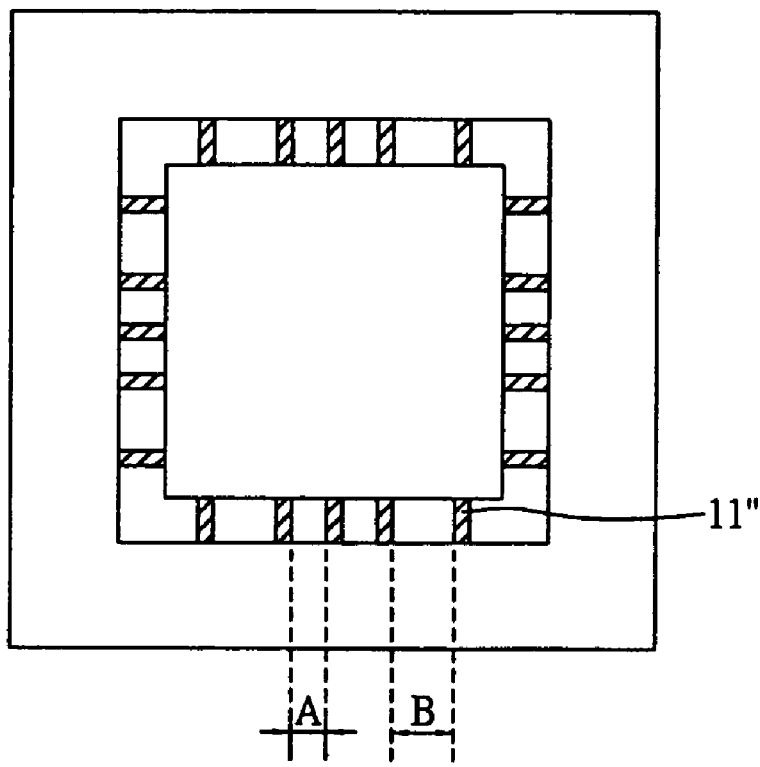
Figure 1D:
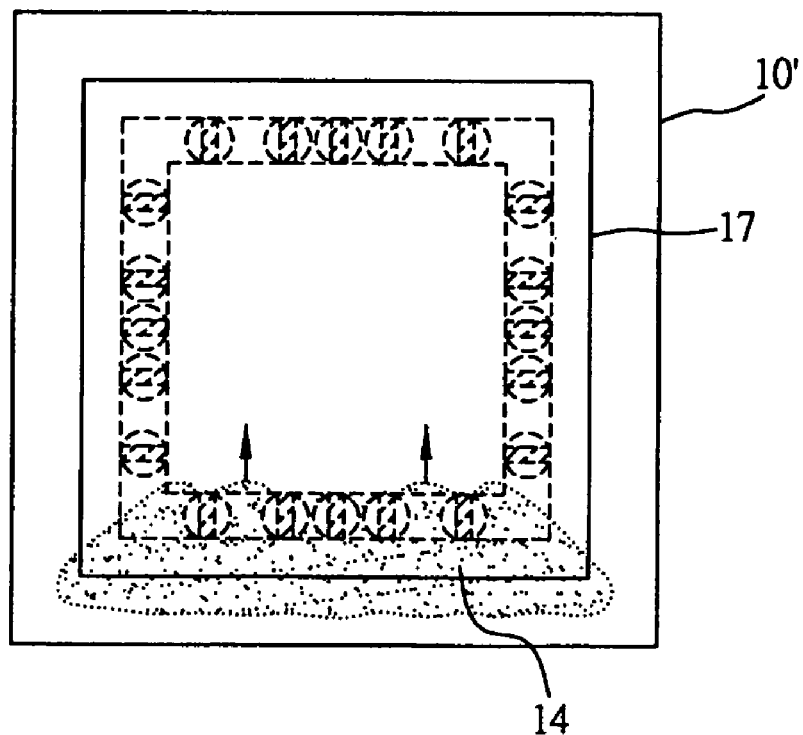
FIGS. 1d to 1f (PRIOR ART) are schematic diagrams showing problems associated with an underfill process for the conventional semiconductor package.
Figure 1E:
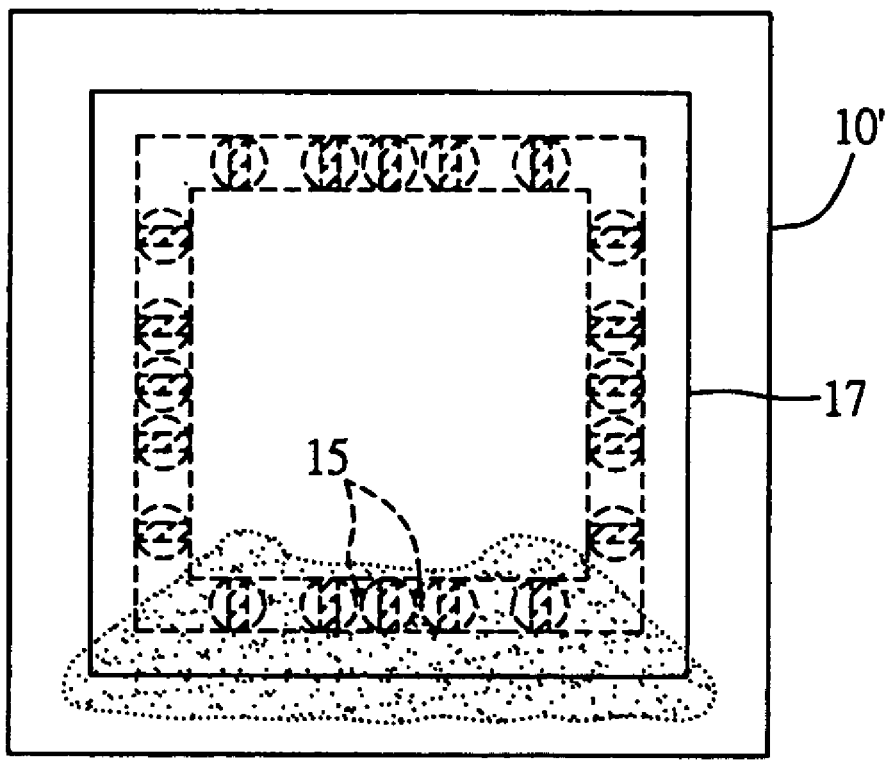
Figure 1F:
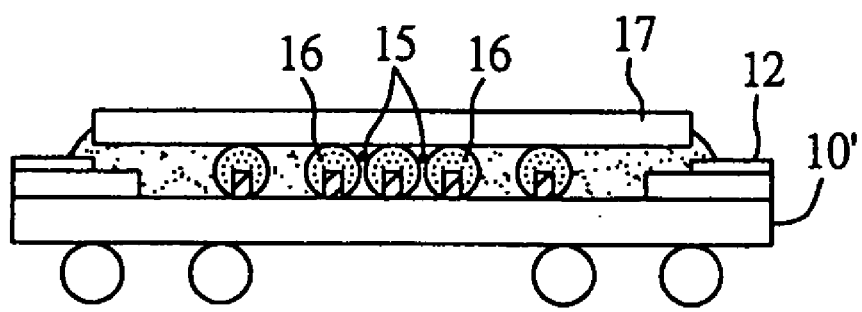
Figure 2:
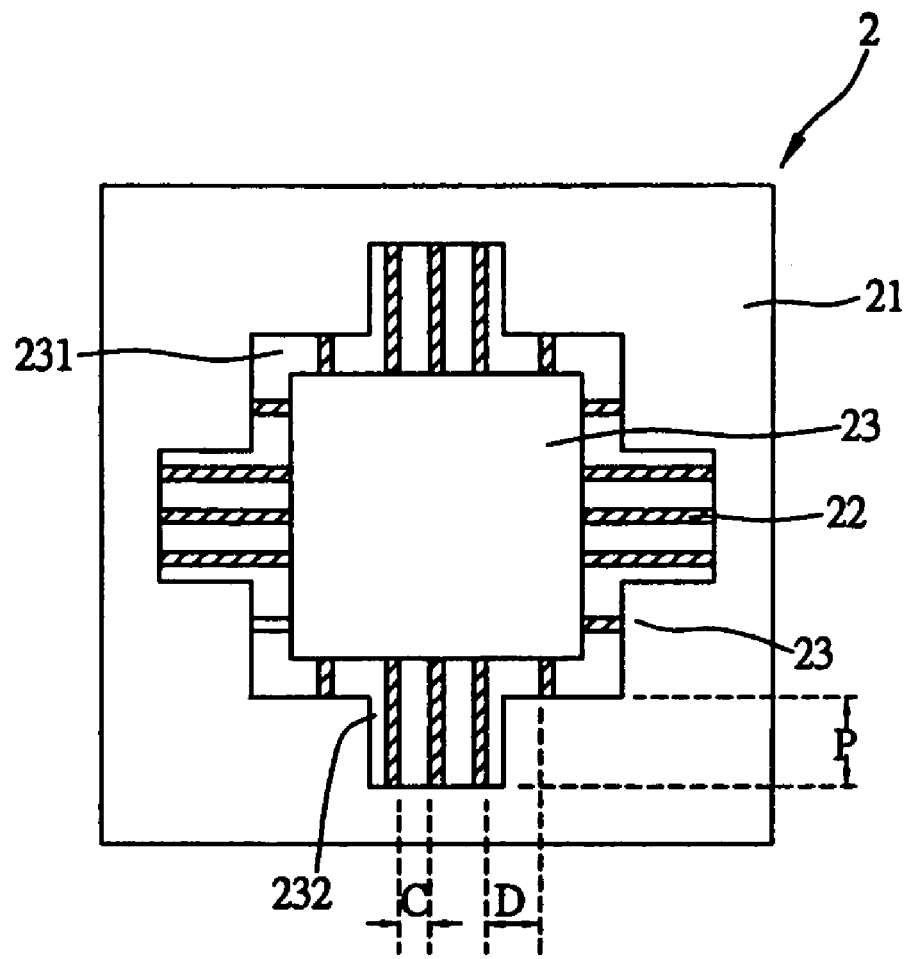
FIG. 2 is a schematic diagram showing a partial top view of a semiconductor chip package according to the present invention.
Figure 3:
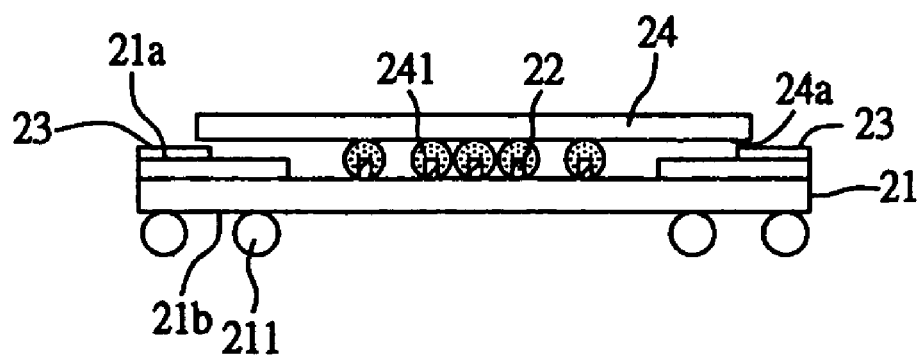
FIG. 3 is a partial cross-sectional diagram showing a semiconductor chip mounted on a chip carrier according to the present invention.

FIGS. 2 and 3 show a chip carrier 2 for a semiconductor chip according to a preferred embodiment of the present invention. It is to be noted here that the above drawings and other drawings depicted in the specification are made in simplicity and only showing the components related to the chip carrier in the present invention. The actual layout and fabrication processes for the semiconductor package should be more complicated and are not to be further described herein.

In this embodiment, as shown in FIGS. 2 and 3, the chip carrier 2 comprises a chip carrier body 21, a plurality of solder pads 22, and a solder mask layer 23.

The chip carrier body 21 serves as a medium for establishing an electrical connection between the semiconductor package and an external device. In this embodiment, the chip carrier body 21 may be a ball grid array (BGA) substrate. The chip carrier body 21 has a first surface 21a electrically connected to electronic elements, and a second surface 21b opposite to the first surface 21a, allowing a plurality of array-arranged solder balls 211 to be disposed on the second surface 21b and electrically connect the semiconductor package to the external device such as a printed circuit board (not shown). The chip carrier body 21 is further formed with a circuit layer comprising a plurality of conductive traces (not shown).

The plurality of solder pads 22 are formed respectively at one terminal of each of the conductive traces on the chip carrier body 21. In this embodiment, the plurality of solder pads 22 are preferably those formed on the first surface 21a of the chip carrier body 21 to be electrically connected to a semiconductor chip in a flip-chip manner. As shown in FIG. 2, the solder pads 22 and their associated conductive traces are composed of long strips of the circuit layer. Furthermore, there are formed a pitch C and a pitch D between the adjacent solder pads 22, wherein the pitch C is sized smaller than or equal to 150 μm in width, and the pitch D is sized greater than or equal to 200 μm in width.

The solder mask layer 23 is formed on the first surface 21a of the chip carrier body 21, for protecting traces or circuits on the chip carrier body 21 from short-circuit or broken-circuit due to scratches and achieving the solder masking effect. In this embodiment, the solder mask layer 23 is formed with a plurality of openings 231 by the foregoing conventional groove forming method to expose on the solder pads 22. An opening extended portion 232 is formed respectively from the openings 231 corresponding to the solder pads 22 having the pitch C and extends outwardly with respect to the chip carrier 2. The formation of opening extended portions 232 increases a space for accommodating the flow of an underfill resin used in an underfill process, such that the underfill resin can flow faster between the solder pads 22 having the relatively narrower pitch C due to reduced resistance. Therefore, unlike the fast flow of the resin between the solder pads having a relatively wider pitch to cause air trapped between the solder pads having a relatively narrower pitch where the resin flows slower for the conventional chip carrier in the prior art, the chip carrier 2 in the present invention can prevent air or voids from being trapped or formed between the solder pads 22 having the pitch C during the underfill process, and thus the yield and reliability of the fabricated package can be assured. Further as shown in FIG. 2, the opening extended portion 232 has a distance or length P of about 2 to 5 times of the width of the relatively smaller pitch C. Preferably, the distance or length P is 3 times of the width of the pitch C.

After the chip carrier 2 is completely prepared according to this embodiment, it is mounted with a semiconductor chip 24 and subjected to an underfill process using an underfill resin 25.

Referring to FIG. 3, the semiconductor chip 24 has a surface 24a formed with a plurality of metal bumps 241 thereon. The metal bumps 241 are soldered to the plurality of solder pads 22 on the chip carrier body 21, making the semiconductor chip 24 mounted and electrically connected to the chip carrier body 21 in a flip-chip manner.

Figure 4A:
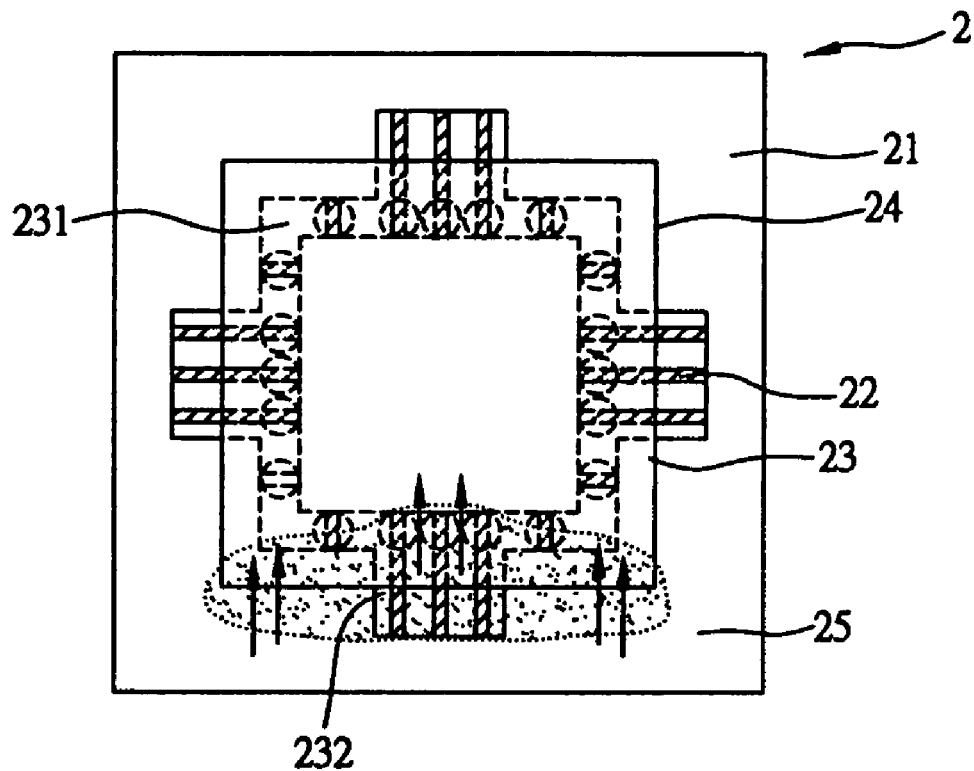
FIGS. 4a and 4b are schematic diagrams showing an underfill process performed for filling a gap between the semiconductor chip and the chip carrier according to the present invention.
Figure 4B:
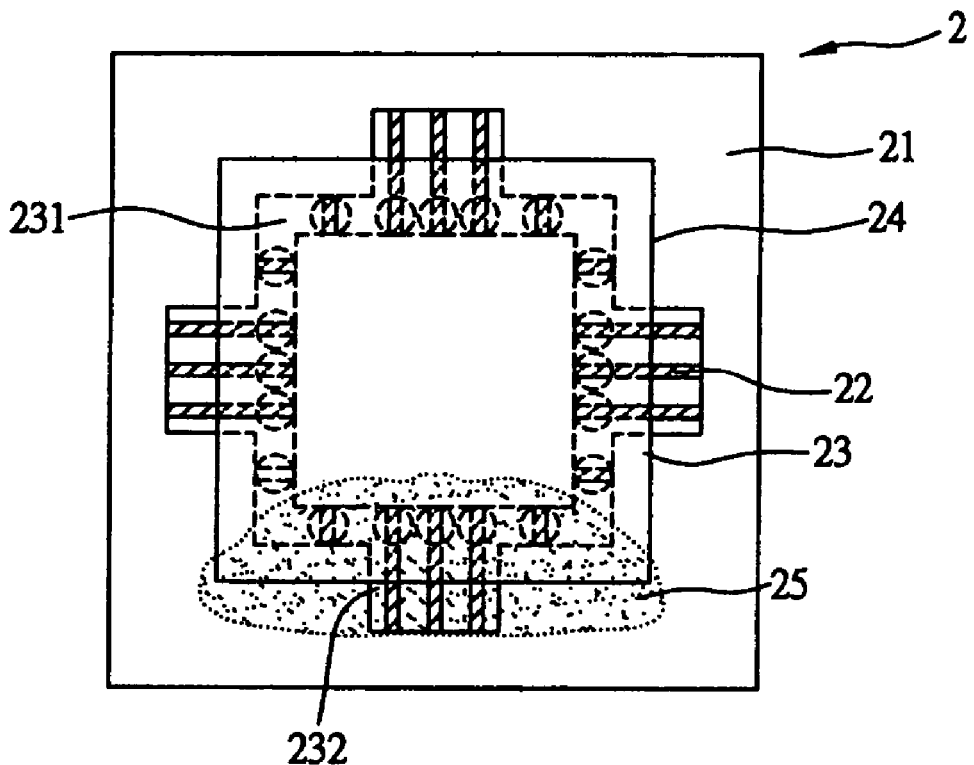

Referring to FIGS. 4a and 4b, after the semiconductor chip 24 is mounted on the chip carrier body 21, the underfill resin 25 is injected from a position of the opening extended portion 232 corresponding to an edge of the semiconductor chip 24. When the underfill resin 25 flows to the opening extended portions 232 that provide an increased space for the flow of the underfill resin 25, making the resin 25 flow faster between solder pads 22 with a relatively narrower pitch due to reduced resistance, unlike the fast flow of the resin between the solder pads having a relatively wider pitch to cause air trapped or voids formed between the solder pads having a relatively narrower pitch where the resin flows slower for the conventional chip carrier in the prior art, such that the present invention can avoid the problem of air trapping or void formation in the prior art.

Therefore, the chip carrier in the present invention is formed with a plurality of solder mask openings having different sizes to correspond to differently sized pitches between solder pads on the chip carrier, so as to prevent formation of voids during an underfill process.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A chip carrier for a semiconductor chip, comprising:
a chip carrier body;
a solder mask layer formed on the chip carrier body and having a plurality of openings; and
a plurality of solder pads exposed in the openings, with at least two differently sized pitches being provided between the adjacent solder pads;
wherein the openings of the solder mask layer corresponding to the solder pads having a relatively smaller pitch of the at least two differently sized pitches are respectively formed with an opening extended portion extending outwardly with respect to the chip carrier.

2. The chip carrier of claim 1, wherein the chip carrier body is a substrate.

3. The chip carrier of claim 1, wherein the openings are formed as grooves in the solder mask layer.

4. The chip carrier of claim 1, wherein the solder pads are for being soldered to a plurality of metal bumps formed on the semiconductor chip, so as to allow the semiconductor chip to be mounted and electrically connected to the chip carrier body in a flip-chip manner.

5. The chip carrier of claim 1, wherein the relatively smaller pitch is sized smaller than 150 μm in width.

6. The chip carrier of claim 1, wherein the relatively smaller pitch is sized equal to 150 μm in width.

7. The chip carrier of claim 1, wherein a length of the opening extended portion is 2 to 5 times of a width of the relatively smaller pitch.

8. The chip carrier of claim 7, wherein the length of the opening extended portion is 3 times of the width of the relatively smaller pitch.

* * * * *